United States Patent
Iwashita et al.

(10) Patent No.: US 7,057,877 B2
(45) Date of Patent: *Jun. 6, 2006

(54) CAPACITOR, METHOD OF MANUFACTURE THEREOF AND SEMICONDUCTOR DEVICE

(75) Inventors: Setsuya Iwashita, Nirasaki (JP); Motohisa Noguchi, Suwa (JP); Takeshi Kijima, Matsumoto (JP); Yasuaki Hamada, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/925,900

(22) Filed: Aug. 25, 2004

(65) Prior Publication Data

US 2005/0068713 A1    Mar. 31, 2005

(30) Foreign Application Priority Data

Aug. 27, 2003  (JP) .............................. 2003-303173
Aug. 27, 2003  (JP) .............................. 2003-303174

(51) Int. Cl.
*H01G 4/06* (2006.01)

(52) U.S. Cl. .................... 361/321.5; 361/313

(58) Field of Classification Search .. 361/321.1–321.5, 361/311–313, 320; 501/134
See application file for complete search history.

(56) References Cited

U.S. PATENT DOCUMENTS

| | | | |
|---|---|---|---|
| 4,266,265 A * | 5/1981 | Maher ...................... | 361/321.4 |
| 5,736,449 A * | 4/1998 | Miki et al. .................. | 438/396 |
| 5,798,903 A * | 8/1998 | Dhote et al. .............. | 361/321.4 |
| 2003/0038311 A1* | 2/2003 | Basceri ....................... | 257/296 |
| 2004/0214352 A1* | 10/2004 | Kijima et al. ................. | 438/3 |
| 2004/0229384 A1* | 11/2004 | Kijima et al. ................. | 438/3 |
| 2004/0232458 A1* | 11/2004 | Natori et al. ................ | 257/295 |
| 2004/0245492 A1* | 12/2004 | Hamada et al. ........ | 252/62.51 R |
| 2005/0017346 A1* | 1/2005 | Yamagata .................... | 257/701 |
| 2005/0068822 A1* | 3/2005 | Kijima et al. ................ | 365/202 |

FOREIGN PATENT DOCUMENTS

| | | |
|---|---|---|
| JP | 5-47587 | 2/1993 |
| JP | 5-82801 | 4/1993 |
| JP | 7-226485 | 8/1995 |
| JP | 9-139480 | 5/1997 |

OTHER PUBLICATIONS

"Piezoelectric Properties of PZT: Influence of (Zr/Ti) Ratio and Niobium Substitution", Haccart et al., Ferroelectrics 2001, vol. 254 pp. 185-195.*

"Ferroelectric and Piezoelectric Properties of Nb Doped PZT films", Haccart et al., Integrated Ferroelectrics, 2001, vol. 35, pp. 239-248.*

"Properties of ferroelectric capacitor YBa2Cu3O7 /Pb(Ta0.05Zr0.48Ti0.47)O3 /YBCO/Pt/TiO2/SiO2/Si" Li et al, Journal of Nanjing University, 2001, vol. 37, No. 5, pp. 619-624.*

"Direct-Write Fabrication of Pb(Nb, Zr, Ti,)O3 Devices: Influence of Paste Rheology on Print Morphology and Component Properties" Morissette et al., J. Am. Ceram. Soc., 2001, vol. 84 No. 11, pp. 2462-2468.*

* cited by examiner

*Primary Examiner*—Eric W. Thomas
(74) *Attorney, Agent, or Firm*—Harness, Dickey & Pierce, P.L.C.

(57) ABSTRACT

A capacitor includes a first electrode and a second electrode, and a dielectric layer sandwiched between the first electrode and the second electrode, wherein the dielectric layer includes $Pb(Zr_xTi_yM_z)O_3$ (where M is at least one material selected from Nb, Ta, and V, and $x+y+z=1$).

10 Claims, 5 Drawing Sheets

CAPACITOR, METHOD OF MANUFACTURE THEREOF AND SEMICONDUCTOR DEVICE

BACKGROUND OF THE INVENTION

1. Field of the Invention

The present invention relates to a capacitor, a method of manufacture thereof, and a semiconductor device which incorporates the capacitor.

Priority is claimed on Japanese Patent Applications Nos. 2003-303173 and 2003-303174, both filed Aug. 27, 2003, the contents of which are incorporated herein by reference.

2. Description of Related Art

Various types of capacitors are utilized as constructional elements in semiconductor devices, as for example disclosed in Japanese Unexamined Patent Applications, First Publications Nos. H07-226485, H09-139480, H05-82801, and H05-47587. For example, in oscillator circuits or power supply circuits which are implemented as semiconductor devices, capacitors are utilized for an operational amplifier (op-amp) oscillation prevention, stabilization, and smoothing, and in booster circuits and the like.

As such a capacitor, if it is to be fitted internally to a circuit which is being constructed, a structure is often utilized in which a dielectric layer such as a silicon oxide layer, a silicon nitride layer, or an oxidized silicon nitride layer or the like is sandwiched between upper and lower electrode layers which are made from silicon, metal, or titanium nitride, aluminum nitride, or the like. Furthermore, as a type of capacitor which is utilized for being fitted externally to a circuit or the like, there is a type which consists of a layered condenser which includes a dielectric layer made from a ceramic such as titanium barium oxide or the like.

Furthermore, normally, for making this type of capacitor, and in particular for making its dielectric layer, a spattering method or a CVD method or a laser ablation method or the like is employed.

In this connection, the capacitance of a capacitor is proportional to the permittivity and to the area of its dielectric layer, and is inversely proportional to its thickness. Accordingly, if it is desired to produce a capacitor of small size and high capacitance for being fitted internally to a circuit, from the point of view of leak current, it is anticipated to increase its capacitance by making its dielectric layer from a material which has high permittivity. On the other hand, if it is desired to produce a capacitor which is to be fitted externally to a circuit, there is a strong demand to keep the cost of manufacture low and to enhance the yield rate, so that it is desirable to be able to manufacture the capacitor with a very thin dielectric layer in an easy manner.

Against this background, when the permittivity of the dielectric layer of a capacitor is considered in relation to the area and the layer thickness of the capacitor, it is considered desirable for this permittivity to be at least 300 in the case of a capacitor which is to be fitted internally to a circuit, and at least 1000 in the case of one which is to be fitted externally.

However, for a capacitor which is manufactured in the interior of a circuit, it is possible to utilize a layer of silicon oxide, a layer of silicon nitride, or a layer of oxidized silicon nitride or the like as the dielectric layer, these dielectric layers have a low permittivity which is less than or equal to 10, and accordingly, in order to enhance their capacitance, it is necessary to increase their area, or the like. If the area of the capacitor is increased in this manner, then the area which the capacitor occupies in the circuit becomes undesirably large, and this undesirably hinders the task of making the circuit more compact.

As materials which have high permittivity there are, for example, strongly dielectric materials such as titanium silicon oxide lead oxide and titanium barium oxide and the like. With this type of strongly dielectric material, it is necessary to keep the temperature at which their layer is manufactured to be below 450° C., due to the influence which is exerted upon other semiconductor elements and lead wires which are provided within the same semiconductor device. However, at this kind of low temperature, it is difficult for crystallization to take place, and accordingly the dielectric layer which is obtained is indeed one which has a high permittivity as compared with a silicon oxide layer or the like, but still it is not possible for it to attain the desired very high permittivity. In addition, the variation of the permittivity with respect to change of frequency and change of temperature is large, so that, from this point of view, the resulting component is one which is inferior, as compared to one which employs a silicon oxide layer or the like.

In addition, in a method of manufacture of this type of capacitor, and in particular since its dielectric layer is manufactured by utilizing a spattering method, a CVD method, a laser ablation method or the like, there are the problems that the initial cost which is required for purchase of a large scale layer manufacturing device becomes high, and furthermore the running cost also becomes high, since a large amount of energy is needed for manufacturing the layers. Moreover, if patterning is performed by etching after layer manufacture, the efficiency of utilization of the raw material is poor, and also the cost becomes undesirably high since various liquid chemicals come to be required for photo-litho masking and etching; furthermore, there is the problem that the productivity is deteriorated, since the number of processes is augmented.

On the other hand, in the case of manufacture of a capacitor which is intended to be fitted externally to a circuit, such as one which is made from a ceramic such as titanium barium oxide or the like, while the cost of the capacitor itself remains low, there are problems such as the fact that assembly cost is entailed by positioning the capacitor when fitting it externally and by bonding it or the like to other elements, and with regard to yield and so on, so that it is not possible to attain sufficient cost reduction.

The present invention has been conceived in the light of the above described problems, and it takes as its objective to provide: a capacitor which, due to incorporating a dielectric layer of high permittivity, is capable of promoting the compactness of a device in which it is incorporated; a method of manufacture of a capacitor which is capable of producing this capacitor at a low cost; and a semiconductor device which incorporates this type of capacitor.

SUMMARY OF THE INVENTION

The first aspect of the present invention is a capacitor having a first electrode and a second electrode, and a dielectric layer sandwiched between the first electrode and the second electrode, wherein the dielectric layer includes $Pb(Zr_xTi_yM_z)O_3$ (where M is at least one material selected from Nb, Ta, and V, and x+Y+z=1).

According to this capacitor, the permittivity of this dielectric layer which has as its principal component $Pb(Zr_xTi_yM_z)O_3$ is high. Accordingly, it becomes possible to make a device in which this capacitor is included more compact.

Furthermore, with this capacitor, it is desirable for the composition ratio of Zr, Ti and M within the $Pb(Zr_xTi_yM_z)O_3$ satisfies the following equation: $0.2 \leq z/(x+y) \leq 0.9$ When this is done, the permittivity of this dielectric layer which has as its principal component $Pb(Zr_xTi_yM_z)O_3$ becomes yet higher.

Furthermore, with this capacitor, it is desirable for Si to be added to the dielectric layer. Moreover, it is desirable for this Si to be added to the dielectric layer as a metallic silicate in an amount greater than or equal to 0.1 mole percent and less than or equal to 10.0 mole percent.

When this is done, it is possible to reduce the firing temperature when forming the dielectric layer, because the Si acts as a catalyst. Accordingly, if for example other semiconductor elements or lead wires or the like are formed upon the base, it becomes possible to reduce the thermal influence which is exerted upon them. Furthermore, if the amount of the Si which is added as a metallic silicate is less than 0.1 mole percent, then the action of this Si as a catalyst does not appear sufficiently well; while, if the amount of the Si which is added as a metallic silicate is greater than 10.0 mole percent, then the permittivity is deteriorated, because the amount of the $Pb(Zr_xTi_yM_z)O_3$ is relatively reduced.

Furthermore, with this capacitor, it is desirable for the dielectric layer to be in the amorphous phase, or to be in a mixture of the amorphous phase and the crystalline phase.

By ensuing that a certain amount of the amorphous phase is included in this manner, it becomes possible to form the dielectric layer by firing at a comparatively low temperature. Accordingly, if for example other semiconductor elements or lead wires or the like are formed upon the base, it becomes possible to reduce the thermal influence which is exerted upon them.

Furthermore, with this capacitor, it is desirable for the dielectric layer to be in a mixture of the amorphous phase and the crystalline phase, and the crystalline phase to be formed in a discontinuous state between the first electrode and the second electrode.

When this is done, since the crystalline phase is formed in a discontinuous between the first electrode and the second electrode, therefore the dielectric layer does not have a strong hysteresis characteristic, with respect to the relationship between its amount of polarization and the voltage which is applied, like a strongly dielectric material. Accordingly, its behavior is easily controlled, and it becomes easy to design a circuit to which this capacitor is fitted, and moreover the losses of energy in such a circuit become small.

A second aspect of the present invention is a method of manufacture of a capacitor having a structure in which a dielectric layer is sandwiched between a first electrode and a second electrode, comprising the steps of forming the first electrode upon a base, depositing upon the first electrode by a droplet discharge method a liquid material containing a precursor compound for $Pb(Zr_xTi_yM_z)O_3$ (where M is at least one material selected from Nb, Ta, and V, and $x+y+z=1$), and forming the dielectric layer including $Pb(Zr_xTi_yM_z)O_3$ (where M is at least one material selected from Nb, Ta, and V, and $x+y+z=1$) by heat processing the deposited liquid material.

According to this method of manufacture of a capacitor, it is possible to manufacture a dielectric layer of high permittivity which has $Pb(Zr_xTi_yM_z)O_3$ as its principal component, and thereby it is possible to anticipate making a device to which this capacitor having this type of dielectric layer is fitted more compact.

Furthermore, since the liquid material is deposited by a droplet discharge method, and then the dielectric layer is formed by heat processing this liquid material, accordingly the requirement for a large scale layer manufacturing device is eliminated, and moreover it becomes possible to reduce the cost, since economies are realized from the point of view of efficiency of use of the source material and in energy consumption and the like. Yet further, since by depositing the liquid material in the desired position it becomes unnecessary to perform patterning by etching, accordingly the dielectric layer is no longer damaged as a result of such etching.

Furthermore, with this method of manufacture of a capacitor, it is desirable for there to be further included a step of, before the step of depositing upon the first electrode by the droplet discharge method the liquid material including the precursor compound, forming a self organizing layer upon the surfaces of the base and the first electrode using fluoroalkylsilane. Yet further, it is desirable for there to be further included a step of, after the step of forming a self organizing layer upon the surfaces of the base and the first electrode using fluoroalkylsilane, irradiating light upon the fluoroalkylsilane which has been formed upon the surface of the first electrode.

If this is done, when depositing the liquid material upon the first electrode, the liquid material is prevented from spreading out from upon the first electrode over its periphery and off it, since the liquid repellent section which is made from fluoroalkylsilane is formed upon the base surface around the periphery of the first electrode. Accordingly, it becomes possible to form a dielectric layer of the desired shape upon the first electrode.

Furthermore, with this method of manufacture of a capacitor, it is desirable, in the step of forming the dielectric layer by heat processing the liquid material for the temperature for heat processing to be less than or equal to 450° C.

When this is done, if for example other semiconductor elements or lead wires or the like are formed upon the base, it becomes possible to reduce the thermal influence which is exerted upon them.

Furthermore, with this method of manufacture of a capacitor, it is desirable for the first electrode to be made by the steps of depositing upon the base by a liquid drop discharge method a first liquid material in which first minute particles are dispersed in a first dispersion medium, eliminating the first dispersion medium by heat processing the first liquid material, and sintering the first minute metallic particles.

When this is done, since, for the first electrode as well, liquid material is deposited by using a droplet discharge method, and this liquid material is subjected to heat processing to form the first electrode, accordingly the requirement for a large scale layer manufacturing device is eliminated, and moreover it becomes possible to reduce the cost, since economies are realized from the point of view of efficiency of use of the source material and in energy consumption and the like.

Furthermore, with this method of manufacture of a capacitor, it is desirable for the second electrode to be made by the steps of depositing upon the base by a droplet discharge method a second liquid material in which second minute particles are dispersed in a second dispersion medium, eliminating the second dispersion medium by heat processing the second liquid material, and sintering the second minute metallic particles.

When this is done, since, for the second electrode as well, liquid material is deposited by using a droplet discharge method, and this liquid material is subjected to heat processing to form the second electrode, accordingly the requirement for a large scale layer manufacturing device is eliminated, and moreover it becomes possible to reduce the cost, since economies are realized from the point of view of efficiency of use of the source material and in energy consumption and the like.

Furthermore, with this method of manufacture of a capacitor, it is desirable for the first minute metallic particles to be minute particles made from at least one of platinum, iridium, ruthenium, gold, or silver, and for the heat processing temperature at which the first minute metallic particles are sintered to be less than or equal to 400° C.; and, moreover, it is desirable for the second minute metallic particles to be minute particles made from at least one of platinum, iridium, ruthenium, gold, or silver, and for the heat processing temperature at which the second minute metallic particles are sintered to be less than or equal to 400° C.

When this is done, it becomes possible to manufacture an electrode which is made from a metallic layer which has low electrical resistance, and which is stabilized so that it cannot easily oxidize. Furthermore, since the heat processing temperature is kept less than or equal to 400° C., accordingly, if for example other semiconductor elements or lead wires or the like are formed upon the base, it becomes possible to reduce the thermal influence which is exerted upon them.

A third aspect of the present invention is a semiconductor device, which includes a capacitor as described above, or a capacitor which has been manufactured by a method as described above.

With this semiconductor device, by incorporating a capacitor which has been made more compact by equipping it with a dielectric layer of high permittivity, it becomes possible to make the semiconductor device itself more compact as well.

Furthermore, in particular, if the dielectric layer is manufactured by using a droplet discharge method, then it becomes possible to reduce the overall cost.

A fourth aspect of the present invention is a method of manufacture of a capacitor having a structure in which a dielectric layer is sandwiched between a first electrode and a second electrode, having the steps of forming the first electrode upon a base; a process of depositing upon the first electrode by a droplet discharge method a liquid material which includes a material for forming the dielectric layer; forming the dielectric layer by heat processing the deposited liquid material; and forming the second electrode upon the dielectric layer.

With this method of manufacture of a capacitor, since the dielectric layer is manufactured by depositing a liquid material with a droplet discharge method, and this liquid material is then subjected to heat processing, accordingly the requirement for a large scale layer manufacturing device is eliminated, and moreover it becomes possible to reduce the cost, since economies are realized from the point of view of efficiency of use of the source material and in energy consumption and the like. Yet further, since by depositing the liquid material in the desired position it becomes unnecessary to perform patterning by etching, accordingly the dielectric layer is no longer damaged as a result of such etching.

BRIEF DESCRIPTION OF THE DRAWINGS

FIG. 3A is a perspective view showing essential elements of a discharge head, while

DETAILED DESCRIPTION OF THE INVENTION

In the following, the present invention will be explained in detail.

Figure 1:
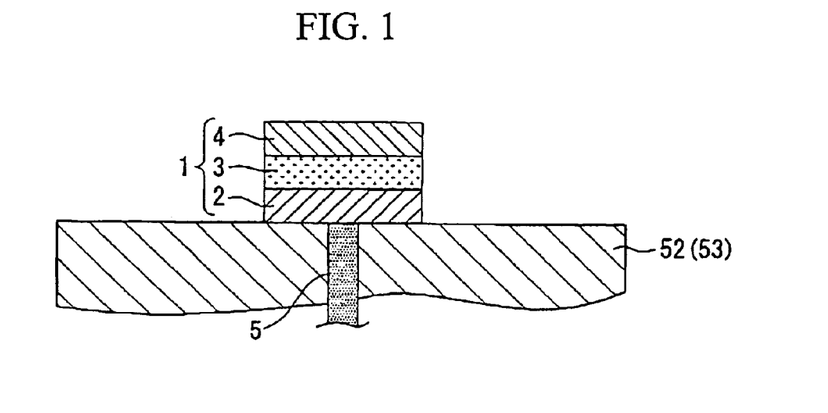
FIG. 1 is a side sectional view showing a preferred embodiment of the capacitor according to the present invention.

FIG. 1 is a figure showing an embodiment of the capacitor of the present invention, and, in this figure, the reference symbol 1 denotes the capacitor. The capacitor 1 is one which, in a semiconductor device 50 shown in FIG. 2 which constitutes a preferred embodiment of the present invention, may, for example, be used as capacitors 1a which replace internal capacitors in a prior art type of circuit, and furthermore as a capacitor 1b which replaces an externally fitted capacitor for such a circuit.

Figure 2:
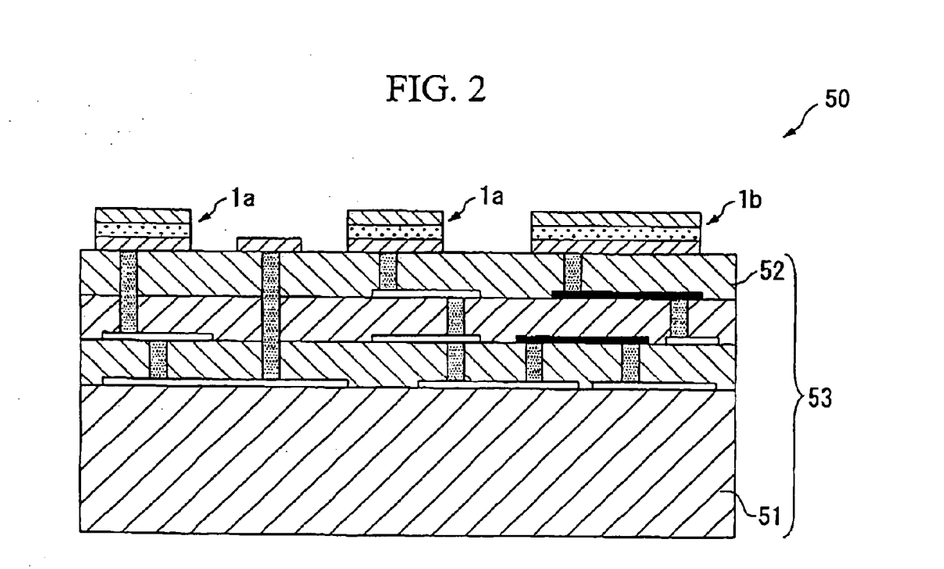
FIG. 2 is a side sectional view showing a preferred embodiment of the semiconductor device according to the present invention.

Here, in the semiconductor device 50, various transistors and memory elements are formed from CMOS transistors or the like upon a substrate 51, and furthermore various lead wires or plugs or the like which electrically connect between them or between the capacitors 1a and 1b are formed upon insulating layers between layers or within insulating layers between layers. Furthermore, the structures up to the inter-layer insulating layer 52 which constitute the backing upon which the capacitors 1a and 1b are formed will, from the point of view of the present invention, simply be referred to as the base 53. In addition, a protective layer and lead wires and the like are formed over the capacitors 1a and 1b, and moreover an insulating layer is formed so as to cover these, although this matter is not shown in the drawings.

As shown in FIG. 1, the capacitor 1 which is utilized as the capacitors 1a and 1b is one which is made upon the inter-layer insulating layer 52 (i.e. upon the base 53) which is made from, for example, polyimide, and the capacitor 1 includes a first electrode 2 which is formed upon the inter-layer insulating layer 52, a dielectric layer 3 which is formed over the first electrode 2, and a second electrode 4 which is formed over the dielectric layer 3. In other words, this capacitor 1 is one which is made by sandwiching the dielectric layer 3 between the first electrode 2 and the second electrode 4, and an embedded lead wire 5 which is formed in the inter-layer insulating layer 52 is connected to the first electrode 2, while furthermore another lead wire (not shown in the drawings) is connected to the second electrode 4.

In this first preferred embodiment of the present invention, both the first electrode 2 and the second electrode 4 are sintered metallic bodies which are made by sintering minute metallic particles. In concrete terms, they are made by sintering minute particles which are made from at least one material selected from platinum, iridium, ruthenium, gold, and silver.

The dielectric layer 3 is made from a material which has, as its principal component, $Pb(Zr_xTi_yM_z)O_3$ (where M is at least one material selected from Nb, Ta, and V, and $x+y+z=1$) which is made by adding another metal to titanium zirconium oxide lead oxide $(Pb(Zr,Ti)O_3)$. With this dielectric layer 3, its permittivity becomes higher as compared to one which is made from, for example, titanium zirconium oxide lead oxide $(Pb(Zr,Ti)O_3)$, and accordingly it becomes possible for the above described capacitor 1 which includes $Pb(Zr_xTi_yM_z)O_3$ to have a higher capacitance as compared with the prior art; while, if it is designed to have the same capacitance as in the prior art, it becomes possible to make it more compact.

With this type of dielectric layer 3, it is desirable for the composition ratio of Zr, Ti, and M in the $Pb(Zr_xTi_yM_z)O_3$ to satisfy the relationship $0.2 \leq z/(x+y) \leq 0.9$; and, furthermore, it is more desirable for it to satisfy the relationship $x/y \leq 1.5$. If this is done, as will be described hereinafter, the permittivity of this dielectric layer 3 which includes the $Pb(Zr_xTi_yM_x)O_3$ as its principal component becomes greater, and accordingly it becomes easier to promote increase of its capacitance, and/or to make it more compact.

Furthermore, with this dielectric layer 3, it is desirable for Si to be added as a component other than the $Pb(Zr_xTi_yM_2)O_3$ which constitutes its principal component. Moreover, in this case, it is desirable for the Si to be added as a metallic silicate to the dielectric layer 3 in greater than or equal to 0.1 mole percent and less than or equal to 10.0 mole percent, and it is more desirable for it to be added in greater than or equal to 0.5 mole percent and less than or equal to 8.0 mole percent; and it is even more desirable for it to be added in greater than or equal to 1.0 mole percent and less than or equal to 5.0 mole percent. When Si is added in this manner, this added Si comes to act as a catalyst when firing the precursor material for the dielectric layer 3 and forming the oxide as a principal component, as will be explained hereinafter. In other words, even if it is arranged for the firing temperature to be low, a crystalline layer of $Pb(Zr_xTi_yM_z)O^3$ is caused to be formed due to the action of this catalyst, and accordingly it becomes possible to obtain a high permittivity. Furthermore, due to the fact that it is possible to set the firing temperature to be low, it also becomes possible to reduce the thermal influence upon the other semiconductor elements (such as CMOS circuitry and the like) and upon the lead wires upon the base 53.

Furthermore, if the quantity of Si which is added as a metallic silicate becomes less than 0.1 mole percent, then the action of the Si as a catalyst is no longer exhibited satisfactorily; whereas, if it is greater than 10.0 mole percent, then the permittivity is deteriorated because the amount of $Pb(Zr_xTi_yM_z)O_3$ is relatively reduced. Furthermore, as an added amount so that, at the same time as causing this type of action of the Si as a catalyst to appear satisfactorily, deterioration of the permittivity does not occur, it is desirable for the quantity of Si which is added as a metallic silicate to be greater than or equal to 0.5 mole percent and less than or equal to 8.0 mole percent; and it is more desirable for this quantity to be greater than or equal to 1.0 mole percent and less than or equal to 5.0 mole percent.

Here when, as will be explained hereinafter, the precursor material for the dielectric layer 3 is fired so as to create an oxide (the dielectric layer 3) which has as its principal component the $Pb(Zr_xTi_yM_z)O_3$, then the dielectric layer 3 which is obtained comes to be in the amorphous phase, or in a mixed state of the amorphous phase and the crystalline phase, and in particular, if Si has been added as has been previously described, it comes to be in a mixed state which includes a proportion of the crystalline phase.

By bringing about a state which includes a proportion of the crystalline phase in this manner, the dielectric layer 3 comes to be one which is made by firing at a comparatively low temperature. Accordingly, it becomes possible to reduce the thermal influence which is exerted upon the other semiconductor elements (such as CMOS elements and the like) and upon the lead wires and the like which are provided upon the base 53, as previously explained.

Furthermore, in particular, if the dielectric layer 3 comes to be in a mixed state which includes a proportion of the crystalline phase, then it is desirable for the crystalline phase to be created in a discontinuous state, and not in a state in which it is continuous between the first electrode 2 and the second electrode 4. If the crystalline phase is created in a discontinuous state between the first electrode 2 and the second electrode 4 in this manner, then this dielectric layer 3, in the relationship between its amount of polarization and the voltage which is applied, ceases to have any hysteresis, like a strong dielectric. Accordingly, it becomes easy to control its behavior, so that the design of circuits in which it is incorporated becomes easy, and furthermore the losses of energy are also reduced.

Next, a preferred embodiment of the method of manufacture of a capacitor according to the present invention will be explained based upon a method of manufacture of the capacitor 1 with the above described structure. Furthermore, by way of example, this preferred embodiment of the method of manufacture of a capacitor according to the present invention will be described in terms of the case of its application to the manufacture of the capacitor 1 (1a, 1b) in the semiconductor device 50 shown in FIG. 2.

Furthermore, the droplet discharge method of the present invention is a method of forming a desired pattern by discharging droplets which are made from a liquid material in a desired pattern upon a base, and it may be generically described as an ink jet method or the like. However, as the liquid material (the droplets) which is to be discharged, this is not a so called ink which is used for printing, but is a liquid material which includes various types of substances for manufacturing devices, and as such substances, in concrete terms, there may be suggested substances which are endowed with a function of acting as electrically conductive substances or insulating substances, or the like.

First, before explaining the concrete method of manufacture of the capacitor 1, an example of a discharge head which is used in a droplet discharge method will be explained.

Figure 3A:
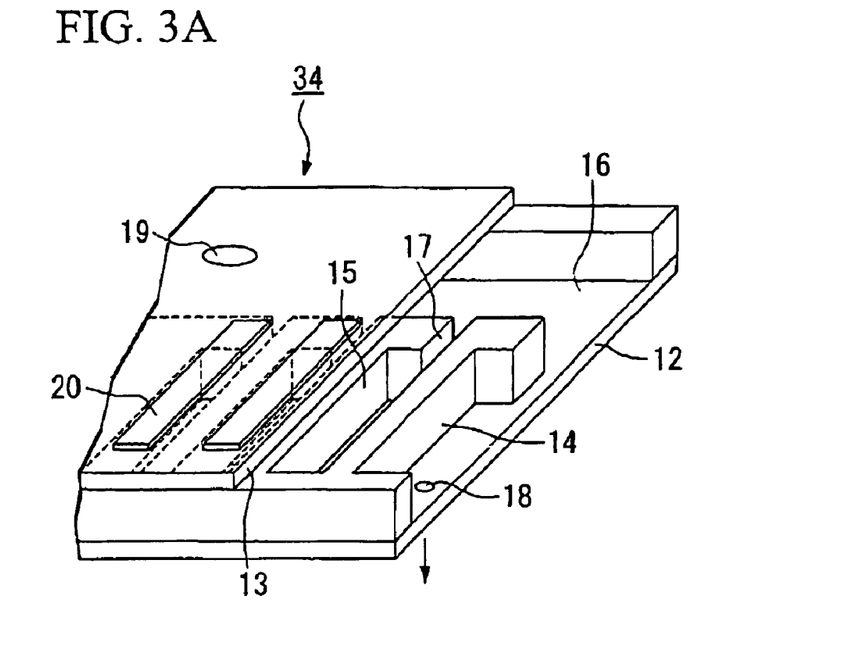
Figure 3B:
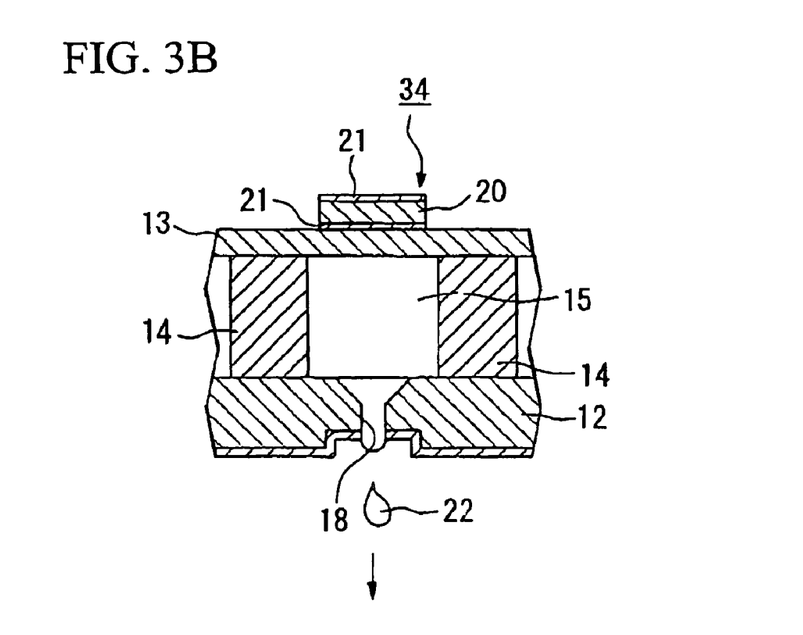
FIG. 3B is a side sectional view showing the same.

As shown in FIGS. 3A and 3B, this discharge head 34 includes a nozzle plate 12 which is for example made of stainless steel, and a vibrating plate 13, and these are connected together via a partition member (a reservoir plate) 14. A plurality of cavities 15 and a reservoir 16 are defined between the nozzle plate 12 and the vibrating plate 13 by the partition member 14, and these cavities 15 and the reservoir 16 are communicated together via flow conduits 17.

Liquid material is filled within the interiors of these cavities 15 and the reservoir 16, and the flow conduits 17 between these have the function of acting as supply orifices which supply liquid material from the reservoir 16 to the cavities 15. In addition, a plurality of hole shaped nozzles 18 for ejecting liquid material from the cavities 15 are formed in the nozzle plate 12 and are arranged in a vertical and horizontal array. On the other hand, a hole 19 is formed in the vibrating plate 13 so as to open within the reservoir 16, and a liquid material tank (not shown in the figures) is connected to this hole 19 via a tube (also not shown).

In addition, piezoelectric elements (piezo elements) 20 are connected to the surface of the vibrating plate 13 which is on the opposite side thereof from the surface which faces towards the cavities 15, as shown in FIG. 3B. These piezoelectric elements 20 are sandwiched between pairs of electrodes 21, and are made so as to flex towards the outside upon the application of electrical power.

The vibrating plate 13 with this structure, and to which the piezoelectric elements 20 are connected, is integral with the piezoelectric elements 20 and flexes towards the outside at the same time as each of them does, so that thereby the volumes of the corresponding ones of the cavities 15 are made to increase. When this occurs, if the interior of the cavities 15 and the interior of the reservoir 16 are connected together, and liquid material is charged into the reservoir 16, then an amount of the liquid material which corresponds to the proportion by which the volume of the cavity 15 has increased flows from the reservoir 16 via the corresponding flow conduit 17 into that cavity 15.

In addition, when, from this state, supply of electrical power to the piezoelectric element 20 corresponding to that cavity 15 is cut off, the piezoelectric element 20 and the vibrating plate 13 both return to their original states together. Accordingly, the cavity 15 also returns to its original volume, so that the pressure of the liquid material in the interior of that cavity 15 rises, and the liquid material is discharged from the corresponding nozzle 18 as liquid drops 22.

Furthermore, as a discharge device for the discharge head, it would also be acceptable to utilize some device other than the above described electromechanical conversion element employing the piezoelectric elements (piezo element) 20; for example, it would also be possible to employ a method which utilized an electro-thermal conversion element as the energy generation element, or a so called continuous method of an electrification control type or of a pressure vibration type, or an electrostatic attraction method, or a method in which heat was generated in the liquid material by irradiating it with electromagnetic radiation from a laser or the like, and the liquid material was discharged by the action of this generated heat.

(A Method of Manufacture of the First Electrode)

Figure 4A:
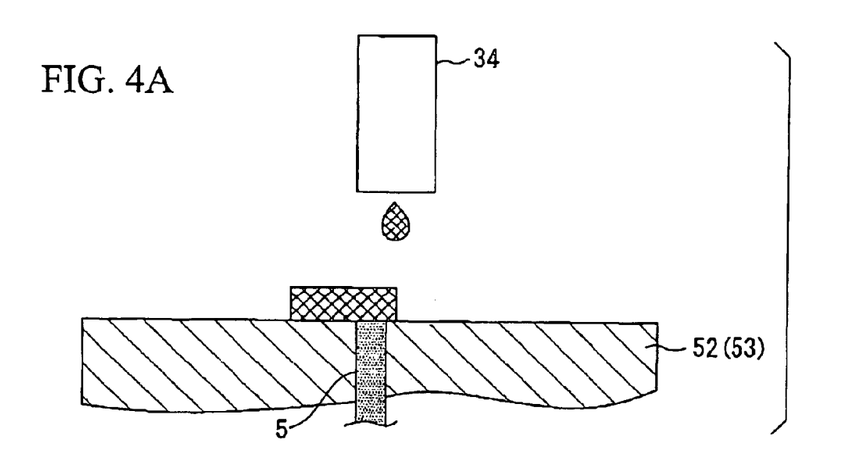
FIGS. 4A to 4D are side sectional views for explanation of a method of manufacture of a capacitor.

First, as shown in FIG. 4A, liquid material which includes minute metallic particles is deposited in desired positions upon the base 53 (upon the interlayer insulating film 52), in other words upon the embedded lead wire 5, by utilizing a droplet discharge method (an inkjet method) using the discharge head 34, These minute metallic particles which are included in the liquid material in other words the minute metallic particles which constitute the material for formation of the first electrode 2, consist of one or a plurality of types of material selected from platinum, iridium, ruthenium, gold, silver, and the like, and these minute metallic particles are dispersed within the liquid material which acts as a dispersion medium. It is desirable for the diameter of the metallic particles to be greater than or equal to 50 nm and less than or equal to 0.1 μm, and, by their diameter being within this range, it becomes easy to disperse them in the dispersion medium, and moreover the quality of the discharge from the discharge heat 34 becomes good. Furthermore, it would also be acceptable to enhance the dispersability of the minute metallic particles within the dispersion medium by coating their surfaces with an organic material or the like.

As the dispersion medium in which the minute metallic particles are dispersed, it is desirable for its vapor pressure at room temperature to be greater than or equal to 0.001 mmHg and less than or equal to 200 mmHg. This is because, if the vapor pressure of the dispersion medium at room temperature is greater than 200 mmHg, then, when forming the layer applied by discharge, the medium evaporates too quickly, which is undesirable, and it is difficult to form an applied layer of good quality. On the other hand, if the vapor pressure of the dispersion medium at room temperature is less than 0.001 mmHg, then the speed of drying becomes rather slow, and it becomes easy for some of the dispersion medium to remain within the applied layer, so that, after subsequent processing by thermal irradiation, there is a difficulty in obtaining an electrically conductive layer of good quality. Furthermore, in particular, if the vapor pressure of the dispersion medium is less than 50 mmHg, then it becomes difficult for a nozzle blockage to occur due to drying when discharging the droplets from the discharge head 34, so that this condition is more desirable, in order to make it possible to obtain a stable discharge.

As the solvent which is utilized, this is not particularly limited, provided that it is one in which the minute metallic particles can be dispersed properly without any occurrence of cohesion. In concrete terms, apart from water, there may be suggested alcohol type solvents such as methanol, ethanol, propanol, butanol or the like, hydrocarbon type solvents such as n-heptane, n-octane, decane, toluene, xylene, cymene, durane, indene, dipentene, tetrahydronaphthalene, decahydronaphthalene, cyclohexylbenzene, or the like, ether type solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxy-ethyl)ether, p-dioxane, or the like, or polar solvents such as propylene carbonate, γ-butyrolactone, N-methyl-2-pyrrolidone, dimethyl formamide, dimethyl sulfoxide, cyclohexanon, or the like. Among these, from the point of view of dispersability of the minute metallic particles and stability of the dispersion, and from the point of view of easiness of applicability to an inkjet method, water, alcohol type solvents, hydrocarbon type solvents, and ether type solvents are preferred, and, furthermore, water or a hydrocarbon type dispersion medium may be considered as being the most desirable type of solvent, The dispersion medium which is employed may be one of these dispersions mediums by itself, or may be a mixture of two or more thereof.

When forming the dispersion by dispersing the minute metallic particles in the dispersion medium, it is desirable for the concentration of the minute metallic particles within the dispersion medium to be greater than or equal to 1 weight % and less than or equal to 80 weight percent, and, in particular, it is desirable to adjust this concentration within this range according to the layer thickness of the metallic layer which is being formed (the first electrode 2). This is because, if this concentration is greater than 80 weight %, then it becomes difficult to obtain an even applied layer because clumps of the minute metallic particles can easily form; while, if this concentration is less than 1 weight %, then a long time period comes to be required for drying in order to evaporate the dispersion medium, and accordingly the productivity of the process is deteriorated.

Furthermore, according to requirements, within the range in which it does not lose its desired functions, it would also be acceptable to add a minute quantity of a substance for surface tension adjustment, such as a fluoride type material, a silicon type material, a non-ionic type material, or the like, to the dispersion medium for the minute metallic particles.

A non-ionic type substance for surface tension adjustment serves several functions: it is beneficial for improvement of the wetting by the dispersion of the surface of the object which is to be covered, it ensures improved levelness of the resultant layer, it generates rashes in the resultant layer, and it serves to prevent occurrence of a so-called orange peel surface, or the like. With regard to the dispersion of minute metallic particles which has been prepared by the addition of such a non-ionic type substance for surface tension adjustment, it is desirable for its viscosity to be greater than or equal to 1 mPa·s and less than or equal to 50 mPa·s. This is due to the fact that, if the viscosity is less than 1 mPa·s, then it is easy for the peripheral edge portion of the nozzle of the liquid drop discharge head 34 to become wetted by discharge of the liquid material, which is undesirable; while, if the viscosity is greater than 50 mPa·s, then the frequency of lumps occurring at the nozzle aperture undesirably increases.

Furthermore, with regard to this dispersion of the minute metallic particles which has been prepared in this manner, it is desirable for its surface tension to be within a range of greater than or equal to $2.0 \times 10^{-2}$ N/m and less than or equal to $7.0 \times 10^{-2}$ N/m. This is due to the fact that, if the surface tension is less than $2.0 \times 10^{-2}$ N/m, then it becomes easy for bending the droplet orbit to occur, since the wettability of the material which makes up the ink with respect to the surface of the nozzle is increased; while, on the other hand, if the surface tension is greater than $7.0 \times 10^{-2}$ N/m, then it becomes difficult to control the amount of discharge of the material which makes up the ink and its discharge timing, since the state of the meniscus at the nozzle tip is not stable.

Figure 4B:
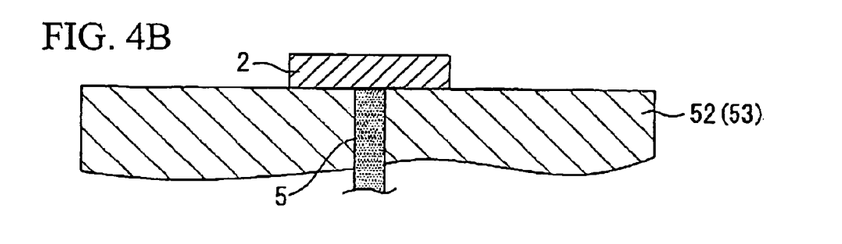

This kind of liquid with the minute metallic particles dispersed in it is deposited in the desired position upon the inter-layer insulating layer 52 by the discharge head 34, and, after the desired pattern has been painted with this liquid with dispersed minute metallic particles, heat processing is performed upon this liquid with dispersed minute metallic particles by heating up the base 53. When this is done, the dispersion medium is eliminated from the liquid with dispersed minute metallic particles, and furthermore the minute metallic particles are subjected to sintering, so that, as shown in FIG. 4B, sufficiently good electrical contact is established between the minute particles; and thereby the first electrode 2 is formed.

It is possible to employ conventionally utilized conditions as the conditions of heat processing, since they are not particularly limited. For example, as the surrounding pressure, it will be acceptable to perform the heat processing at atmospheric pressure, and moreover, according to requirements, it will also be acceptable to perform it in an atmosphere of a non reactive gas such as argon, helium, or the like. The temperature for heat processing should be determined appropriately in consideration of the boiling point of the dispersion medium (i.e. in consideration of its vapor pressure), and in consideration of the ambient pressure and the thermal behavior of the minute metallic particles; and it is considered to be particularly desirable to employ a temperature of less than or equal to 400° C. This is because, if, for example, other semiconductor elements or aluminum lead wires, or a protective layer or an insulating layer or the like made from resin, is formed upon the base 53, then, by keeping the processing temperature less than or equal to 400° C., it is possible to keep the thermal influence upon such elements sufficiently low.

As the heating method for this heat processing, apart from conventional processing with a hot plate or an electric oven or the like, it is also possible to utilize processing by lamp annealing. If heat processing with a hot plate or an electric oven or the like is utilized, suitable conditions therefor may be a heat processing temperature of, for example, 300° C., and a processing time of 30 minutes. By forming the first electrode 2 under conditions of this sort, it becomes possible to obtain a first electrode 2 of a thickness of, for example, about 0.1 µm.

Furthermore, as the light source for the light which is employed for such lamp annealing, while this is not particularly limited, it is possible to utilize as this light source, for example, an infrared lamp, a xenon lamp, a YAG laser, an argon laser, a carbonic acid gas laser, or an excimer laser which utilizes XeF, XeCl, XeBr, KrF, KrCl, ArF, ArCl or the like. Generally these light sources have output powers in the range from 10 W to 5000 W, but, for this preferred embodiment, it is considered that the range from 100 W to 1000 W will be sufficient.

(A Method of Manufacture of the Dielectric Layer)

Next, as a precursor material for manufacturing the $Pb(Zr_xTi_yM_z)O_3$ (where M is at least one material selected from Nb, Ta, and V, and $x+y+z=1$), a metallic salt, such as a metallic alkoxide or a carbonic acid salt or the like, is prepared for each of these metallic elements, thus including the metallic material which is included in each one of these oxides, i.e. Pb, Zr, Ti, and M (which is at least one selected from Nb, Ta, and V). Furthermore, apart from these, Si is prepared, for example as lead silicate. In addition, these metallic compounds are mixed together so that the composition ratio of Zr and Ti and M in the $Pb(Zr_xTi_yM_z)O_3$ satisfies $0.2 \leq (x+y) \leq 0.9$, and also $x/y \leq 1.5$, and moreover the ratio between the mole amount of Pb and the mole amount of (Zr+Ti+M) (i.e. the total of the mole amounts of Zr, Ti, and M) becomes 1:1. Furthermore, the lead silicate is mixed in as well, so that the amount of lead does not violate the conditions, and so that, in the dielectric layer which is finally obtained, the Si is included in a range greater than or equal to 0.1 mole percent and less than or equal to 10.0 mole percent. Furthermore, for the precursor compound which is mixed in in this manner, in order to be able to provide a material which is suitable for discharge by the droplet discharge method, it is desirable to prepare the liquid material in sol form by adding an appropriate solvent or dispersion medium or the like such as, for example, an alcohol type compound or the like.

Next, the liquid material in sol form which has been prepared in this manner is deposited (painted) upon the first electrode 2 by the discharge head 34 so as to have an even thickness.

And next, the solvent in the liquid material is eliminated by drying at a predetermined temperature for a predetermined period of time. Furthermore, after this drying, the resultant dried material is grease-removed for a predetermined time period (for example, 30 minutes) at a predetermined high temperature (for example, 400° C.) under atmospheric pressure conditions, and thereby the organic component which is coordinated in the metallic material is separated by heat, so that the metallic material is oxidized and is converted into metallic oxide. And a layer of metallic oxide of the desired thickness is formed by repeating these deposition, drying, and grease-removing processes a predetermined number of times.

Figure 4C:
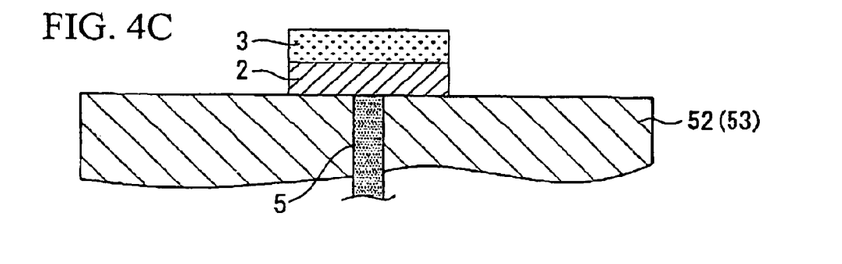

After this, heat processing is performed in an RTA (Rapid Thermal Annealing) oven while flowing oxygen over the workpiece at a predetermined temperature, for example, a temperature less than or equal to 450° C., and desirably a temperature between 400° C. and 450° C., and more desirably a temperature of 450° C., and thereby the metallic oxide is fired, and, as shown in FIG. 4C, a dielectric layer 3 of thickness about 0.2 μm is formed over the first electrode 2. By thus performing heat processing at a temperature less than or equal to 450° C., in particular if other semiconductor elements or lead wires or the like are formed upon the base 53, it is possible to reduce the thermal influence which is exerted upon them. Furthermore, this heat processing need not be performed in an RTA oven; other means may be employed.

There is a possibility that, when forming the dielectric layer 3 from this liquid material in sol form in this manner, the liquid material may spread out during discharge, which is undesirable, so that it may become difficult to obtain the desired shape, in other words to cover the entire surface of the first electrode 2 almost completely.

In order to prevent this occurring, before forming the dielectric layer 3 in this manner, it would be acceptable to form, upon the surface of the base 53 (the interlayer insulating layer 52) upon which the first electrode 2 has been formed, a liquid repellent section which has low affinity with respect to the liquid material in sol form—for example, to form a self organizing layer using fluoroalkylsilane.

(Another Method of Manufacture of the Dielectric Layer)

It would also be possible for the principal component of the dielectric layer 3 not to be the above described $Pb(Zr_{\,x}Ti_{y}M_{z})O_{3}$ (where M is at least one selected from Nb, Ta, and V, and x+y+z=1); for example, it might have, as its principal component, lead zirconate titanium $(Pb(Zr,Ti)O_{3})$ or barium-strontium titanium oxide $((Ba_{1-x}Sr_{x})TiO_{3})$.

For example, if a dielectric layer 3 made from Pb(Zr,Ti)O$_3$ is to be produced, then, as a precursor material therefor, a metallic salt, such as a metallic alkoxide or an acetic acid salt or the like, is prepared for each of these metallic elements, thus including the metallic material which is included in each one of these oxides, i.e. Pb, Zr, and Ti.

Then, these metallic compounds are mixed together so that the composition ratio of Pb and Zr and Ti in the Pb(Zr,Ti)O$_3$ becomes a predetermined ratio which is set in advance. Furthermore, for the precursor compound which is mixed in in this manner, in order to be able to provide a material which is suitable for discharge by the droplet discharge method, it is desirable to prepare the liquid material in sol form by adding an appropriate solvent or dispersion medium or the like such as, for example, an alcohol type compound or the like.

Next, the liquid material in sol form which has been prepared in this manner is deposited (painted) upon the first electrode 2 by the discharge head 34 so as to have an even thickness.

And next, the solvent in the liquid material is eliminated by drying at a predetermined temperature (for example, 200° C.) for a predetermined period of time (for example, 10 minutes). Furthermore, after this drying, the resultant dried material is grease-removed (pre-fired) for a predetermined time period (for example, 10 minutes) at a predetermined high temperature (for example, 400° C.) under atmospheric pressure conditions, and thereby the organic component which is coordinated in the metallic material is separated by heat, so that the metallic material is oxidized and is converted into metallic oxide. And a layer of metallic oxide of the desired thickness is formed by repeating these deposition, drying, and grease-removing processes a predetermined number of times.

After this, heat processing is performed in, for example, an RTA oven while flowing oxygen over the workpiece at a predetermined temperature, for example, a temperature between 350° C. and 450° C., for a period of, for example, ten minutes, and thereby the metallic oxide is fired, and, as shown in FIG. 4C, a dielectric layer 3 of thickness about 0.2 μm is formed over the first electrode 2. It is desirable to perform this heat processing at a temperature which is low enough for the resulting dielectric layer not to crystallize completely, in order that this dielectric layer should not exhibit any electrical hysteresis. Furthermore, it is desirable to utilize a heat processing temperature of not more than 450° C., in order not to impart any undesirable thermal influence upon the base 53.

There is a possibility that, when forming the dielectric layer 3 from this liquid material in sol form in this manner, the liquid material may spread out during discharge, which is undesirable, so that it may become difficult to obtain the desired shape, in other words to cover the entire surface of the first electrode 2 almost completely.

In order to prevent this occurring, before forming the dielectric layer 3 in this manner, it would be acceptable to form, upon the surface of the base 53 (the interlayer insulating layer 52) upon which the first electrode 2 has been formed, a liquid repellent section which has low affinity with respect to the liquid material in sol form—for example, to form a self organizing layer using fluoroalkylsilane.

(A Method of Manufacture of the Liquid Repellent Section)

Figure 5:
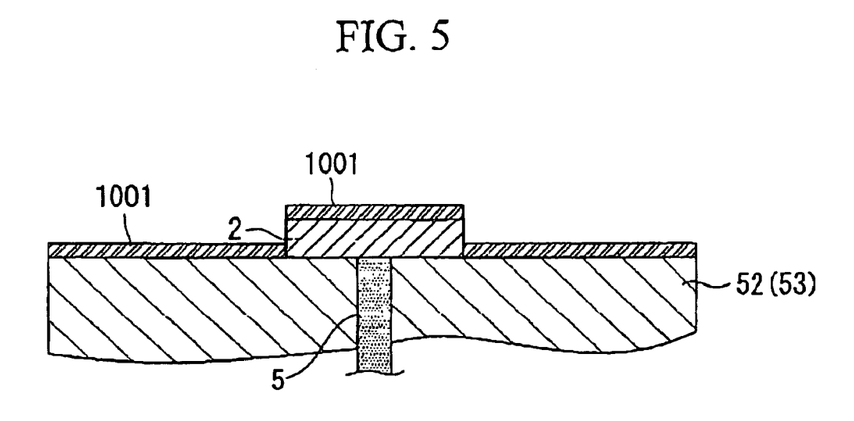
FIG. 5 is a side sectional view for explanation of an example of manufacture of a liquid repellent section.

For forming this liquid repellent section, as shown for example in FIG. 5, a self organized layer 1001 made from fluoroalkylsilane or the like is formed upon the surface of the base 53, in other words upon the surface of the first electrode 2 and upon the exposed surface of the inter-layer insulating layer 52, so as to have a predetermined contact angle with respect to the liquid material in sol form. It is desirable for this contact angle to be greater than or equal to 20° and less than or equal to 60°.

An organic molecular layer for processing the surfaces of the first electrode 2 and the interlayer insulating layer 52 is made as a self organized molecular layer, for example a mono-molecular layer which bonds to both their surfaces, and includes a first functional group which is capable of bonding to the surfaces, a second functional group which reforms the surface characteristics of a lyophilic base or a liquid repellent base or the like at its other side, in other words which controls the surface energy, and a linear carbon chain or a partially branched carbon chain which connects together these first and second functional groups.

As the self organized layer 1001, this is a layer which is made from bonding functional groups which are capable of reacting with the constituent atoms of the first electrode 2 and the interlayer insulating layer 52 which constitute the backing layer, and, apart from this, linear chain molecules; and which is made by orienting this compound, which has extremely high orientability due to the mutual action of the linear chain molecules. Accordingly, the layer thickness of this self organizing layer 1001 becomes extremely thin due to the fact that it is made by orienting individual molecules, and furthermore this layer becomes uniform at the molecular level. Moreover, since the same molecules are positioned at the surface of this layer, this means that uniform and excellent liquid repellence or liquid attraction are presented there.

Fluoroalkylsilane (FAS) may appropriately be employed as this compound having high orientability, in other words as the compound for manufacture of the self organized layer, due to the reasons that it offers good adhesion upon the side of the base 53, and good liquid repellence, and so on. If fluoroalkylsilane is utilized, uniform liquid repellence is presented at the surface of the self organized layer 1001, since this layer is formed by orienting each molecule so as to position the fluoro-alkyl base at the surface of the layer.

As such a type of fluoroalkylsilane, for example, there may desirably be employed hepta-deca-fluoro-1,1,2,2 tetra-hydro-decyl-triethoxy-silane, hepta-deca-fluoro-1,1,2,2 tetra-hydro-decyl-trimethoxy-silane, hepta-deca-fluoro-1,1,2,2 tetra-hydro-decyl-trichloro-silane, tri-deca-fluoro-1,1,2,2 tetra-hydro-octyl-triethoxy-silane, tri-deca-fluoro-1,1,2,2 tetra-hydro-octyl-trimethoxy-silane, tri-deca-fluoro-1,1,2,2 tetra-hydro-octyl-trichloro-silane, tri-fluoro-propyl-trimethoxysilane, or the like. Furthermore while, during use, a single compound (FAS) may be utilized individually, it would also be acceptable to utilize two or more compounds (FAS) together.

For manufacturing this type of self organized layer 1001, the source compound (FAS) and the base 53 are put into the same closed container. When this has been done, one possible procedure is to leave them there for two to three days at room temperature, and thereby the self organized layer 1001 is formed upon the base 53. On the other hand, another possible procedure is to maintain the entire closed vessel at a temperature of 100° C., and in this case the self organized layer 1001 is formed upon the base 53 in about three hours.

Furthermore, instead of this method of manufacture from the gaseous phase, it is also possible to form the self organized layer 1001 from the liquid phase. For example, it is possible to make the self organized layer 1001 upon the base by immersing the base in a liquid which contains the source compound, by washing it, and by drying it.

Furthermore, it is desirable, before manufacturing the self organized layer 1001, to perform pre-processing by irradiating the base surface with ultraviolet light, or by washing it with a solvent.

By doing this, and by thus making the surface of the first electrode 2 and the surface of the interlayer insulating layer 52 to be liquid repellent, in particular it is made difficult for the liquid material in sol form, when it has been deposited upon the surface of the first electrode 2, to spread out over the surface, and thereby it is possible to prevent the liquid material from spreading out as far as the surface of the interlayer insulating layer 52 and creating a layer thereupon, which would be undesirable, and which would make the dielectric layer 3 which was obtained deviate greatly from the desired shape, which also would be undesirable.

Furthermore, in order to obtain the desired shape for the dielectric layer 3, in other words in order to obtain a shape for it which covers almost the entire surface of the first electrode 2, it is best to form the liquid repellent section upon, at least, the surface of the interlayer insulating layer 52 (the base 53) all around the periphery of the first electrode 2. If this is done, it is not absolutely necessary to make the surface of the first electrode 2 as a liquid repellent section; for example, it would also be acceptable to make a section of it as a liquid attraction section (i.e. as a section whose affinity to the liquid material in sol form is high).

In order to make the surface of the first electrode 2 be a liquid attraction section, for example, ultraviolet light or the like may be irradiated upon the self organized layer 1001 through a mask (not shown in the figures) which is formed with an opening pattern which corresponds to the desired pattern, in other words to the shape of the surface of the first electrode 2. When this is done, the self organized layer 1001 is eliminated in the region which has been irradiated with ultraviolet light, and, for example, the hydroxyl base is exposed at the surface. By doing this, this portion exhibits an extremely wettable characteristic as compared to the FAS region, and constitutes a liquid attraction section.

Furthermore, it would also be acceptable to form a second self organized layer in a region in which the FAS of the type previously described has been eliminated. As a compound for forming this second self organized layer as well, a substance is utilized which, just like the FAS, has a bonding functional group and a functional group which reforms the surface, and the self organized layer is made by bonding the bonding functional group to a hydroxyl base or the like of the base surface. However, as the functional group which reforms the surface of this second self organized layer, there is utilized a substance which exhibits lyophilicity, which is different from the FAS, or a substance whose bonding power with the minute metallic particles is strong; and, in concrete terms, an amino base or a thiol base or the like is utilized. By forming the second self organized layer in this manner, it becomes possible to form a dielectric layer 3 of the desired shape by depositing the liquid material in sol form upon the first electrode 2 in a more reliable manner. Furthermore, the adhesion between the dielectric layer 3 which is obtained and the first electrode 2 is also enhanced. As a compound for forming the second self organized layer in this manner, there may be suggested 3-mercapto-propyl-triethoxy-silane,3-mercapto-propyl-trimethoxy-silane, 3-amino-propyl-triethoxy-silane,3-amino-propyl-trimethoxy-silane, or the like.

(A Method of Manufacture of the Second Electrode)

Figure 4D:
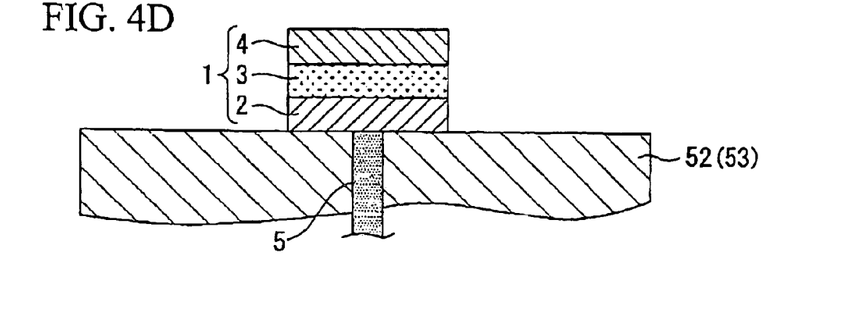

After having made the layers up to and including the dielectric layer 3 in this manner, next, as shown in FIG. 4D, the second electrode 4 is formed upon this dielectric layer 3. For forming this second electrode 4, it is possible to employ almost the same formation method as the method for forming the first electrode 2, described above. In other words, liquid material which includes minute metallic particles is deposited upon the dielectric layer 3 by utilizing a droplet discharge method (an inkjet method) using the discharge head 34, and, after this, the second electrode 4 is made by performing sintering upon the minute metallic particles by executing heat processing. And the capacitor 1 (1a, 1b) is obtained in this manner.

These minute metallic particles which are included in the liquid material, in other words the minute metallic particles which constitute the material for formation of the second electrode 4, consist of one or a plurality of types of material selected from platinum, iridium, ruthenium, gold, silver, and the like, just as was the case with the first electrode 2. Furthermore, as well, in particular, it is desirable to perform the heat processing at a temperature of 400° C. or less.

Furthermore, before manufacturing this second electrode 4, it would also be acceptable to perform a step of manufacturing a liquid repellent section similar to the one which was performed as a pre-processing stage before manufacturing the dielectric layer 3. In other words, it would be acceptable to form a liquid repellent section from fluoroalkylsilane (FAS) or the like, as described previously, over the surface of the dielectric layer 3 and the surface of the interlayer insulating layer 52, in order to prevent the liquid material from spreading out, so that the second electrode 4 is formed selectively over the dielectric layer 3. Furthermore it would be acceptable, when forming the first electrode 2 as previously described as well, before forming it, to form a liquid repellent section upon the surface of the base 53 (the interlayer insulating layer 52) as well. Moreover, when forming these liquid repellent sections as pre-processing stages before forming each of these electrodes 2 and 4 in this manner, it would also be acceptable to form liquid attraction sections by irradiation with ultraviolet light or the like, as previously described, in particular for the locations upon which the liquid material is to be directly deposited.

Yet further, it would also be acceptable to form the first electrode 2 and the second electrode 4, not by employing a droplet discharge method as described above, but by employing a deposition method or a spattering method or the like.

When the second electrode 4 has been manufactured in this manner, the semiconductor device 50 is obtained by forming a lead wire which connects to this second electrode 4, and a protective layer and an insulating layer and the like to cover over the whole.

With the capacitor 1 which has been produced in this manner, the permittivity of the dielectric layer 3 is high due to the fact that its principal component is $Pb(Zr_xTi_yM_z)O_3$, so that this capacitor I which comprises this dielectric layer 3 of high permittivity can have a higher capacitance as compared to a prior art type capacitor; or, to put it in another manner, if one is designing a capacitor to have the same capacitance as one designed according to the prior art, then it becomes possible to make such a capacitor more compact.

Furthermore since, with the above described method of manufacture of such a capacitor 1, the liquid material in sol form is deposited by a droplet discharge method, and the dielectric layer 3 is formed by subjecting it to heat processing, accordingly the necessity for a large scale layer formation device is eliminated, and also it is possible to anticipate a reduction in the overall cost of the process, since it is possible to make gains from the point of view of efficiency of raw material utilization and energy consumption. Moreover, since by depositing the liquid material in the desired position it becomes unnecessary to perform patterning by etching, accordingly the dielectric layer is no longer damaged as a result of such etching, and it is possible to anticipate an enhancement of its characteristics. Yet further, since as described above it is possible to form a dielectric layer 3 which has high permittivity, accordingly it becomes possible to increase the capacitance of the capacitor 1, and/or to make it more compact.

Furthermore, for a semiconductor device which incorporates such a capacitor 1, since it has become possible to make the capacitor 1 more compact because it includes the dielectric layer 3 which is of high permittivity, accordingly it is also possible to make the semiconductor device 50 itself more compact. Moreover, since in particular this dielectric layer 3 is manufactured by employing a droplet discharge method, it becomes possible to reduce the cost yet further.

In addition, it is possible to manufacture different types of capacitors 1 separately upon the same plane, since these capacitors 1 are manufactured by utilizing a droplet discharge method. Accordingly as compared to, for example, the prior art manufacture of a capacitor internal to a circuit and a capacitor which is fitted externally, by applying the process for manufacture of a capacitor according to the present invention, it is possible to manufacture these capacitors easily and moreover at a lower cost. In particular, although it may happen that the capacitance which is required from such a capacitor which is to be utilized internally to the circuit and the capacitance which is required from a capacitor which is fitted externally are different, it is possible to implement this easily when manufacturing these capacitors: for example by utilizing, as materials for manufacturing their dielectric layers, ones which have different permittivity.

(Embodiments)

Next, the present invention will be explained in more concrete terms in terms of preferred embodiments thereof, In preferred embodiments, a capacitor 1 such as the one shown in FIG. 1 was manufactured based upon the process for manufacture shown in FIGS. 4A to 4D.

First, a liquid material in which minute particles of platinum (Pt) were dispersed was discharged by a droplet discharge method, using the above described discharge head 34, in a predetermined position upon an interlayer insulating layer 52 of a base 53 which was made from polyimide, and furthermore, by performing heat processing for 30 minutes at a temperature of 300° C. with a hot plate, a first electrode 2 with a thickness of 0.1 μm was produced.

Next, liquid repellence processing with fluoroalkylsilane (FAS) was performed upon the surface of the base 53 (the interlayer insulating layer 52) including this first electrode 2.

Next, a liquid material which included a precursor compound of $Pb(Zr_xTi_yNb_z)O_3$ (where $x+y+z=1$, and $x/y=0.67$) was deposited upon the first electrode 2 by a droplet discharge method, using the discharge head 34. In this precursor compound, a metallic alkoxide of each of the metallic substances, i.e. of Pb, Zr, Ti, and Nb, was utilized, and they were mixed together so that the mole ratios of the metals therein were equal to predetermined ratios, and the resultant material was prepared as a liquid in sol form. Furthermore, a lead silicate was prepared with the objective of adding Si, and this lead silicate was added to the above described liquid material so that the Si component became 4 mole percent.

Next, drying and grease-removing were performed upon the liquid material which had thus been deposited upon the first electrode 2. And, after repeating the operations of deposition of the liquid material, drying it, and grease-removing it a predetermined number of times, heat processing was performed at a temperature of 450° C. in an RTA oven while flowing oxygen over the workpiece, and thereby the metallic oxides were fired and a dielectric layer 3 of about 0.2 μm in thickness was formed over the first electrode 2.

Next, a liquid material in which minute particles of platinum (Pt) were dispersed was discharged over the dielectric layer 3 by a droplet discharge method, and then heat processing was performed, so as to manufacture a second electrode 4 of thickness about 0.1 μm, which consisted of a Pt layer just as did the first electrode 2; and thereby the capacitor 1 was obtained.

In order to check the characteristics of capacitors 1 which were obtained in this manner, the following experiments were performed.

Experimental Example 1

As liquid materials which were to be used when forming dielectric layers 3 for which the principal component was to be $Pb(Zr_xTi_yNb_z)O_3$ (where $x+y+z=1$, and $x/y=0.67$), such materials were prepared with the mixture ratio of the metallic alkoxide adjusted so that the parameter $z/(x+y)$ varied from 0 to 1. Furthermore the amount of lead silicate which was added was, in each case, 4 mole percent, so that each of these mixture materials conformed to the preferred embodiment described above.

After this, a plurality of types of dielectric layer were manufactures using these mixture materials, and the permittivity ($\in$) of each of these dielectric layers which had been manufactured was measured. The results obtained are shown in FIG. 6 as a graph of the relationship between the parameter ($z/(x+y)$) and the permittivity ($\in$).

Figure 6:
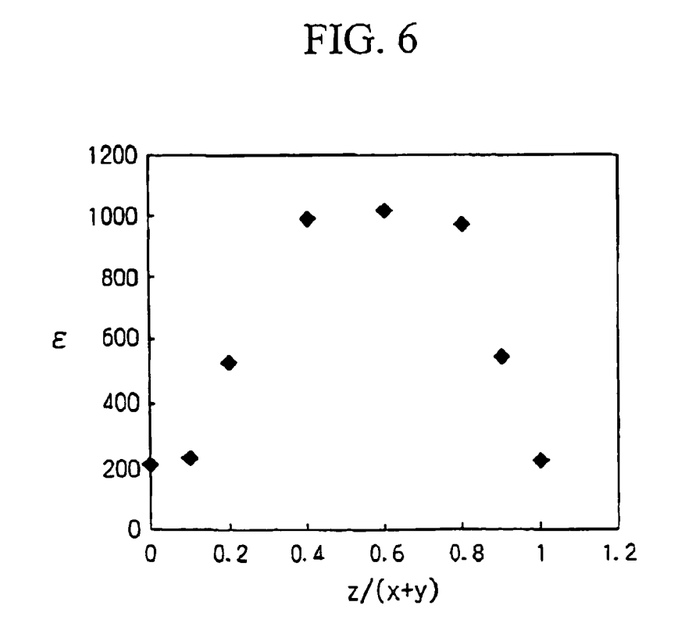
FIG. 6 is a graph showing the relationship between the value of an expression $(z/(x+y))$ and the permittivity.

As shown in FIG. 6, when $z/(x+y)$ was equal to 0, i.e. when no Nb was added, the permittivity was about 200; but, in the range $0.2 \leq z/(x+y) \leq 0.9$, it exhibited a high value greater than or equal to 500. Accordingly, it was determined that the permittivity was increased by adding Nb. Furthermore, in particular in the range $0.4 \leq z/(x+y) \leq 0.8$, the permittivity exhibited a value which was close to 1000. On the other hand, with $0.9 \leq z/(x+y)$, it was seen that the permittivity deteriorated. This deterioration of the permittivity was considered to be due to increase of the leakage current.

In this connection, it was considered that the reason that such a high permittivity was obtained by low temperature firing at such a low temperature like 450° C. was that the dielectric layer which was obtained consisted of a mixed state in which crystalline layers were dispersed within the amorphous phase. Furthermore the presence of crystalline layers was also confirmed by TEM observation.

Furthermore, at this time, the amount of polarization P varied linearly with respect to change of the voltage, and no hysteresis was seen such as with a strong dielectric; instead, the characteristic of a normal dielectric appeared. It is considered that this is due to the fact that, in particular, the crystalline phase was not generated in a continuous state between the first electrode 2 and the second electrode 4, but was generated in a discontinuous state.

Furthermore, with regard to the mole ratio between the Zr and the Ti, there appeared hardly any difference in the permittivity of the dielectric layer which was obtained, provided that $x/y \leq 1.5$.

Experimental Example 2

With the above described preferred embodiment, for a liquid material for forming the dielectric layer 3, in other words for a material with principal component consisting of $Pb(Zr_xTi_yNb_z)O_3$ (where $x+y+z=1$, $z/(x+y)=0.6$, and $x/y=0.67$), and with lead silicate added in 4 mole percent, the relationship between the firing temperature and the permittivity of the dielectric layer 3 which was obtained was investigated. The results which were obtained are shown in FIG. 7.

Figure 7:
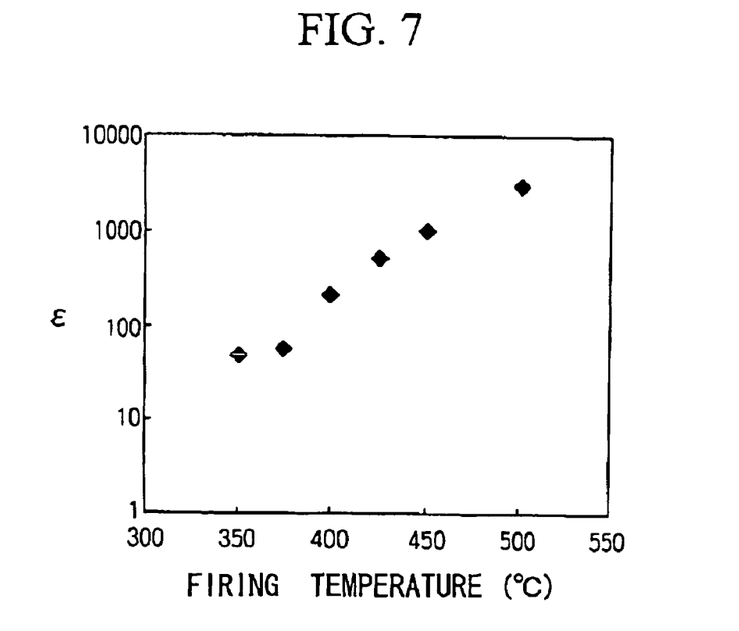
FIG. 7 is a graph showing the relationship between firing temperature and the permittivity of the dielectric layer which is obtained thereby.

As will be understood from FIG. 7, when the firing temperature was 500° C., a high permittivity was obtained.

However, from the results of X axis diffraction for the dielectric layer which was obtained by firing at this type of high temperature, it was also understood that the perovskite phase appeared, and a strong dielectric hysteresis characteristic was observed in the relationship between the amount of polarization P and the applied voltage. Accordingly, it is considered that, if this dielectric layer were to be utilized in a capacitor, the behavior of the capacitor would become hard to control, and furthermore that there would be undesirable results from the point of view of the energy losses becoming great, and the like.

Accordingly, with the present invention, it is desirable for the firing temperature to be 450° C. or less, and in particular it is desirable for it to be in the range from 400° C. to 450° C. By controlling the firing temperature in this manner, it is possible to control the permittivity of the dielectric layer which is obtained.

Experimental Example 3

Figure 8:
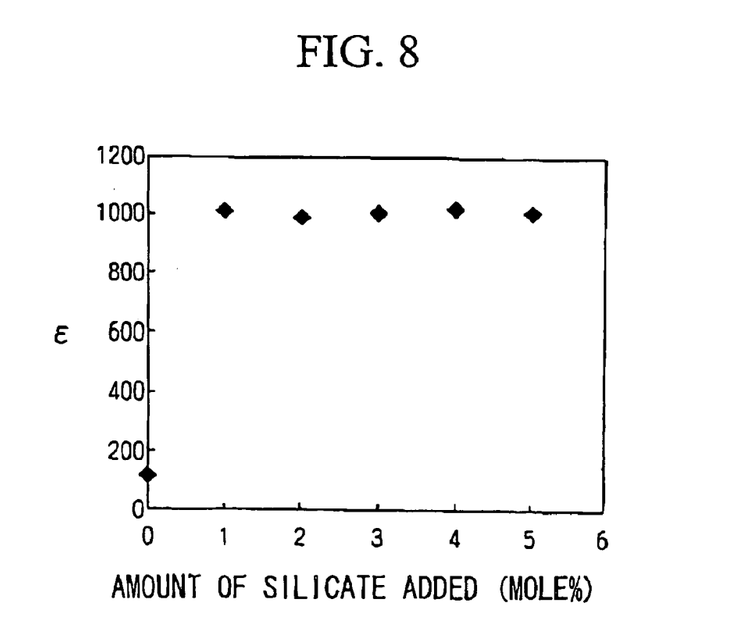
FIG. 8 is a graph showing the relationship between the amount of added silicate and the permittivity.

As liquid materials which were to be used in the preferred embodiment when forming dielectric layers 3 for which the principal component was to be $Pb(Zr_xTi_yNb_z)O_3$ (where $x/y=0.67$), such materials were prepared for investigation with the mole ratio of the Si which was added as lead silicate varying from 0 mole percent to 5 mole percent. After this, various types of dielectric layer were manufactured by utilizing these materials, and the permittivity ($\in$) of each of the dielectric layers which was thus manufactured was investigated. The results which were obtained are shown in FIG. 8 as a graph of the relationship between the amount of silicate added (in mole percent) and the permittivity ($\in$). Furthermore, liquid materials whose satisfied the condition $(z/(x+y))=0.6$ were considered, and that the firing temperature was 450° C.

From FIG. 8 it will be understood that, for a dielectric layer which was made without adding any silicate, its permittivity was about 120, while the permittivity attained a value of near 1000 merely as a result of adding 1 mole percent of silicate. Furthermore, it can be seen that, even when further silicate was added, the permittivity hardly changed at all, so that it is apparent that the characteristic was saturated.

Since, in this manner, it is seen that the permittivity changed abruptly even when such a small amount of silicate as for example 1 mole percent was added, it is considered that the Si (the silicate) acted as a catalyst during firing, as previously described, and that thereby the crystalline phase can be obtained even at a low temperature.

Furthermore, within the above range in which the amount of added silicate was varied, no substantial hysteresis was seen in the relationship between the amount of polarization of the dielectric layer which was obtained and the applied voltage. Accordingly it is considered that, within this range for the amount of added silicate, the crystalline phase did not exist continuously between the first electrode and the second electrode, but rather was formed in the discontinuous state.

Furthermore, for the purposes of comparison, a dielectric layer was formed by the same method as the one of the preferred embodiment from $Pb(Zr_xTi_y)O_3$ (where $x/y=0.67$), without adding any Si (silicate), and by firing at 450° C. When the permittivity ($\in$) of the dielectric layer which was obtained was measured, it was found to be about 80. Accordingly, the beneficial effects with regard to enhancing the permittivity of adding Nb were verified, since even with, for example, the case of the dielectric layer shown in FIG. 8 in which the amount of added silicate was 0 mole percent, the permittivity was about 120, which is higher as compared with this comparison example.

From the above results it will be understood that by adding Nb, and by further adding silicate as well, it is possible to obtain a high permittivity even with firing at a low temperature of 450° C. or lower, and that moreover the leakage characteristics are enhanced.

Moreover it was seen that, by the addition of the silicate, as compared to the case in which no silicate was added, the change of the permittivity with respect to change of temperature and change of frequency was reduced, and in fact the permittivity was almost constant in the range from −30° C. to +100° C., and in the range from 1 kHz to 1 MHz.

Furthermore, although in the above experimental examples Nb was utilized as the M in the $Pb(Zr_xTi_yM_z)O_3$, it would also be acceptable to utilize Ta or V instead, and in such a case it is considered that the same beneficial results would be obtained.

Furthermore if, instead of platinum Pt) being used for the electrodes, iridium (Ir), ruthenium (Ru), gold (Au), or silver (Ag) were used, it is considered that the same beneficial results would be obtained.

Furthermore, in order to obtain a higher capacitance, it would also be acceptable to manufacture the capacitor by mutually superimposing several electrode layers and several dielectric layers in an alternating manner.

As has been described above, by utilizing the capacitor according to the present invention as, for example, a capacitor which is fitted internally to a circuit, instead of a prior art type capacitor, it is possible to make the semiconductor device which is thereby obtained of higher performance and more compact, since the dielectric layer of this capacitor has high permittivity. Furthermore, it may of course also be utilized as a capacitor which is fitted externally, and in this case as well it is possible to anticipate high performance of the resulting semiconductor device, as well as enhanced compactness thereof. Yet further, although it may happen that the individual capacitance which is required may be different between a component which is utilized by being fitted internally to a circuit and a component which is utilized by fitted externally, nevertheless it becomes possible, simply by controlling the amount of Nb which is added and the firing temperature, to control the permittivity of the dielectric layer which is obtained, and accordingly it becomes possible to employ the capacitor according to the present invention in various types of application. Furthermore, if the firing temperature is to be varied, naturally, it is desirable to make that capacitor or capacitors for which the firing temperature is to be the higher, first.

In addition, in particular, by manufacturing the capacitors 1 by utilizing a droplet discharge method, it is possible to manufacture different types of capacitors separately upon the same plane, and accordingly, as compared to, for example, the prior art manufacture of a capacitor internal to a circuit and a capacitor which is fitted externally, by applying the process for manufacture of a capacitor according to the present invention, it is possible to manufacture these capacitors easily and moreover at a lower cost.

While preferred embodiments of the invention have been described and illustrated above, Furthermore these are exemplary of the invention and are not to be considered as limiting. Additions, omissions, substitutions, and other modifications can be made without departing from the spirit or scope of the present invention, Accordingly, the invention is not to be considered as being limited by the foregoing description, and is only limited by the scope of the appended claims.

What is claimed is:

1. A capacitor comprising:
a first electrode and a second electrode; and
a dielectric layer sandwiched between the first electrode and the second electrode,
wherein the dielectric layer includes $Pb(Zr_xTi_yM_z)O_3$ (where M is at least one material selected from Nb, Ta, and V, and $x+y+z=1$), wherein a composition ratio of Zr, Ti and M within the $Pb(Zr_xTi_yM_z)O_3$ satisfies the following equation:

$$0.2 \leq z/(x+y) \leq 0.9.$$

2. A capacitor according to claim 1, wherein Si is added to the dielectric layer.

3. A capacitor according to claim 2, wherein the Si is added to the dielectric layer as a metallic silicate in an amount greater than or equal to 0.1 mole percent and less than or equal to 10.0 mole percent.

4. A capacitor according to claim 2, wherein said Si is added to said dielectric layer as a metallic silicate in an amount greater than or equal to 0.5 mole percent and less than or equal to 8.0 mole percent.

5. A capacitor according to claim 1, wherein the dielectric layer is in the amorphous phase, or is in a mixture of the amorphous phase and the crystalline phase.

6. A capacitor according to claim 1, wherein the dielectric layer is in a mixture of the amorphous phase and the crystalline phase, and
the crystalline phase is formed in a discontinuous state between the first electrode and the second electrode.

7. A semiconductor device comprising a capacitor according to claim 1.

8. A capacitor according to claim 1, wherein $x>0$, $y>0$, and $z>0$.

9. A capacitor according to claim 1, wherein $x/y \leq 1.5$.

10. A capacitor according to claim 2, wherein said Si is added to said dielectric layer as a metallic silicate in an amount greater than or equal to 1.0 mole percent and less than or equal to 5.0 mole percent.

* * * * *

UNITED STATES PATENT AND TRADEMARK OFFICE
CERTIFICATE OF CORRECTION

PATENT NO. : 7,057,877 B2
APPLICATION NO. : 10/925900
DATED : June 6, 2006
INVENTOR(S) : Setsuya Iwashita et al.

It is certified that error appears in the above-identified patent and that said Letters Patent is hereby corrected as shown below:

| | |
|---|---|
| Title Page Item (57) Abstract:, Line 4: | "$M_2$" should be -- $M_z$ --. |
| Column 2, Line 6: | After "silicon oxide", insert -- , --. |
| Column 3, Line 2: | "$M_2$" should be -- $M_z$ --. |
| Column 3, Line 3: | After "0.9", insert -- . --. |
| Column 3, Line 5: | "$M_2$" should be -- $M_z$ --. |
| Column 3, Line 27: | "ensuing" should be -- ensuring --. |
| Column 3, Line 40: | After "discontinuous", insert -- state --. |
| Column 7, Line 20: | "$M_X$" should be -- $M_z$ --. |
| Column 7, Line 24: | "$M_2$" should be -- $M_z$ --. |
| Column 7, Line 38: | "$O^3$" should be -- $O_3$ --. |
| Column 10, Line 44: | "dispersions" should be -- dispersion --. |
| Column 12, Line 31: | "0.2(x+y)" should be -- $0.2 \leq z/(x+y)$ --. |
| Column 18, Line 63: | "manufactures" should be -- manufactured --. |
| Column 20, Line 6: | "whose" should be -- which --. |
| Column 21, Line 15: | After "by", insert -- being --. |
| Column 21, Line 34: | "Furthermore" should be --furthermore --. |

UNITED STATES PATENT AND TRADEMARK OFFICE
CERTIFICATE OF CORRECTION

PATENT NO. : 7,057,877 B2
APPLICATION NO. : 10/925900
DATED : June 6, 2006
INVENTOR(S) : Setsuya Iwashita et al.

It is certified that error appears in the above-identified patent and that said Letters Patent is hereby corrected as shown below:

Column 21, Line 38: "invention," should be -- invention. --.

Signed and Sealed this

First Day of May, 2007

JON W. DUDAS
*Director of the United States Patent and Trademark Office*